(12) United States Patent
Liu et al.

(10) Patent No.: US 8,237,470 B2
(45) Date of Patent: Aug. 7, 2012

(54) UNIVERSAL IO UNIT, ASSOCIATED APPARATUS AND METHOD

(75) Inventors: Hsian-Feng Liu, Hsinchu Hsien (TW); Eer-Wen Tyan, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 12/957,520

(22) Filed: Dec. 1, 2010

(65) Prior Publication Data

US 2011/0128042 A1    Jun. 2, 2011

(30) Foreign Application Priority Data

Dec. 2, 2009    (TW) .............................. 98141239 A (51) Int. Cl.
*H01L 25/00*    (2006.01)

(52) U.S. Cl. .............................. 326/101; 326/41; 326/47

(58) Field of Classification Search .................... 326/62, 326/63, 68, 80, 81, 37–41, 47, 101
See application file for complete search history.

(56) References Cited

U.S. PATENT DOCUMENTS

| | | | |
|---|---|---|---|
| 6,798,069 B1 * | 9/2004 | Ali et al. | 257/775 |
| 2005/0172253 A1 * | 8/2005 | Osanai | 716/10 |
| 2005/0248364 A1 * | 11/2005 | Vadi et al. | 326/39 |

* cited by examiner

*Primary Examiner* — Shawki S Ismail
*Assistant Examiner* — Thienvu Tran
(74) *Attorney, Agent, or Firm* — Edell, Shapiro & Finnan, LLC (57) ABSTRACT

A universal IO unit applied to a chip or an integrated circuit is provided. The universal IO unit includes a power pad and a plurality of signal pads for providing different functions. According to functional requirements of the universal IO unit, the pad power is selectively connected to an electric wire to couple to a predetermined voltage, and each of the signal pads is also selectively connected to a signal wire to transceive signals.

6 Claims, 7 Drawing Sheets

UNIVERSAL IO UNIT, ASSOCIATED APPARATUS AND METHOD

CROSS REFERENCE TO RELATED PATENT APPLICATION

This patent application is based on Taiwan, R.O.C. patent application No. 098141239, filed on Dec. 2, 2009.

FIELD OF THE INVENTION

The present invention relates to an input/output (IO) unit and associated apparatus and method, and more particularly, to a universal IO unit having a power pad and a plurality of signal pads that are selectively programmed to render different functions, and associated apparatus and method.

BACKGROUND OF THE INVENTION

Chips and integrated circuits are crucial hardware foundations of the modern information world. To facilitate chips to exchange signals with other circuits (e.g., other chips/dies, integrated circuits and/or printed circuit boards) as well as acquiring operating electric power, the chips are provided with input/output (IO) units as interfaces for bridging externally.

Each IO unit in a chip is provided generally with a single pad, which connects to other external circuits via corresponding signal wires or electrical wires (e.g., traces) in the conventional structures. Since each IO unit is only configured with one predetermined function at a time, it is necessary that the chip of the prior art be provided with IO units of different structures to respectively perform corresponding functions. For example, certain IO units are capable of signal driving and signal receiving, whereas certain IO units are dedicated for coupling to predetermined voltages (e.g., operation voltage or ground) so that the chip acquires needed operating power.

Apart from the need of distinguishing the IO units according to their functionalities, pads of neighboring IO units are placed in a staggered arrangement for reducing a size of the chip, further demanding that IO units at different positions require different structures. More specifically, even though functions of two IO units might be the same, the structures of the two IO units are bound to be different in order to place corresponding pads of the two IO units in a staggered arrangement. During the design of a chip, the various factors described above may lead to difficulties in automatic placement and routing of the IO units with the conventional structures, so that placement and routing of the IO units are performed manually, thus increasing time and cost need for the chip design.

Further, the foregoing single-pad/single-function IO units lack design and application flexibilities—to realize chips that are adaptable to different interfaces, re-design and re-arrangement of the IO units are needed to satisfy requirements of different interfaces to again add time and cost on such customization. Yet, IO units achieved through the above procedures are incapable of better contributing to integration of the pads, resulting in inapplicability of the IO units when the number of IO units is limited.

SUMMARY OF THE INVENTION

The present disclosure describes a universal IO unit capable of selectively rendering different functions by utilizing a same structure and effectively increasing integration of pads, and associated chip and method.

It is an objective of the invention to provide a universal IO unit. According to an embodiment of the present disclosure, the universal IO unit comprises a power pad, a plurality of signal pads, a power block coupled to the power pad, a plurality of IO blocks respectively coupled to a corresponding signal pad, and a plurality of application blocks respectively coupled to a corresponding IO block. By programming the pads and corresponding circuit blocks, different functions are rendered through the universal IO units with a same structure. The power pad is selectively coupled to a predetermined voltage (e.g., operating voltage or ground) according to a desired function via an electrical wire, and each of the signal pads is selectively coupled a corresponding signal wire according to a desired function via a signal wire to transmit and/or receive signals.

According to an embodiment of the invention, the power blocks of the universal IO units are provided with all sorts of power routings, including power rails. When the interface, formed by connecting the universal IO units with one another, for externally bridging the chip is realized, the power blocks of the universal IO units are also coupled to one another via the power routings so that electric power is transmitted among the universal IO units. Further, in each universal IO unit, the power block is coupled to the power pad to transmit electric power to all the IO blocks and application blocks. Under such structure, by coupling a power pad of a first universal IO unit from the universal IO units to a predetermined voltage, external electric power is transmitted to the first universal IO unit. Thus, in addition to transmitting electric power from the predetermined voltage to various circuit blocks of the first universal IO unit, the power block of the first universal IO unit is also capable of transmitting the electric power to circuit blocks (e.g., IO blocks and application blocks) of second universal IO units without coupling their power pads to the predetermined voltage.

In the universal IO unit of the present disclosure, the plurality of IO blocks coupled to corresponding signal pads are independently controlled and functioned. In one embodiment, each of the IO blocks is independently controlled to decide whether it is to be enabled, and the enable IO blocks are controlled to selectively drive and/or receive signals.

For example, the universal IO unit of the present disclosure can be applicable to a memory interface of a memory controller chip. By setting and controlling an IO block of a universal IO unit to drive and receive signals, a data signal or a data strobe signal can be transceived (transmitted/received) from a corresponding signal pad of the IO block. By setting and controlling another IO block of the same universal IO unit or an IO block of another universal IO unit to drive signals, a clock, an address signal or a command signal can be outputted from the corresponding pad of the IO block. Accordingly, the universal IO unit of the present disclosure is capable of realizing different IO functions by utilizing a same circuit structure. Since the plurality of signal pads and corresponding IO pads in each universal IO unit are independently controlled, various signal IO functions can be simultaneously achieved through appropriate signal wire connections of one single universal IO unit. For example, a same universal IO unit is capable of transceiving data signals via one signal pad and output address signals via another signal pad; that is to say, the universal IO unit of the present disclosure provides optimal design as well as application flexibilities.

It is another objective of the invention to provide a chip applying the foregoing universal IO units of the present disclosure. Apart from a plurality of universal IO units, the chip further comprises a control engine that controls signal transmission (e.g., driving and/or receiving signals) of pads of the universal IO units. More specifically, the control engine is capable of independently setting and enabling IO blocks of the universal IO units; and the enabled IO blocks (and application blocks) are controlled by the control engine to selectively drive and/or receive signals, and also to selectively set the IO blocks so that the IO blocks can operate based on different operating environments and function requirements, e.g., different speeds/frequencies, signal driving capabilities and operating voltages.

For example, the chip of the present disclosure may be a memory controller chip, and the universal IO units are applied to a memory interface. The control engine controls at least one IO block of at least one universal IO unit to drive and receive signals, and to transceive a data signal or a data strobe signal via a corresponding pad of the IO block. Further, the control engine also controls at least one IO block of at least one universal IO unit to drive signals, so as to output a memory clock, an address clock or a command signal from a corresponding pad of the IO block.

In an embodiment according to the present disclosure, the control engine executes a program code at start-up of the chip and respectively sets the signal pads of the universal IO units.

It is yet another objective of the present disclosure to provide a packaged integrated circuit. The integrated circuit comprises the foregoing chip of the invention and a substrate. In the embodiment according to the present disclosure, the substrate can be a ball grid array (BGA) substrate or a quad flat package (QFP) substrate, for example. Further, the integrated circuit may also be a silicon in package (SIP) integrated circuit comprising a plurality of chips and a substrate packaged together, meaning that wire connections between the chip and the substrate of the invention are also applicable to between chips.

As previously described, through settings and control of the control engine according to the present disclosure, universal IO units with a same structure/type are adaptable to different function requirements. A most fundamental application is that either a power pad of a signal pad of each universal IO unit is coupled to a substrate via a wire (electric wire or signal wire). For example, for a universal IO unit that is connected to an operating voltage or ground by coupling its power pad to a substrate, signal pads of the universal IO unit are not connected to the substrate, meaning that corresponding IO blocks and application blocks of the universal IO unit are controllably disabled. Similarly, another universal IO unit may be connected to the substrate by coupling its signal pad for signal transmission in a way that the power pad or other signal pads are left unconnected to the substrate.

In a further application of the present disclosure, by appropriate signal wire configurations, two signal pads of a same IO can be respectively connected to two independent signal pins of a substrate via two isolated signal wires, so that the same universal IO unit is capable of independently realizing two different signal IO functions. Note that a power pad of such universal IO unit need not be coupled to the substrate.

In another embodiment according to the present disclosure, the substrate comprises a power ring and signal pin, and the chip of the invention comprises at least one universal IO unit, which has a power pad connected to the power ring and a signal pad connected to the signal pin via a corresponding signal wire, so that the universal IO unit is capable of not only inputting and outputting signals but also transmitting external electric power to the chip.

It is yet another objective of the invention to provide a method for designing a chip. The method comprises: providing a plurality of universal IO units with a same structure and type, the universal IO units respectively controlled to realize different functions; determining positions and routings and the universal IO units by performing automatic and routing with a computer; respectively setting functions of the universal IO units by utilizing a built-in control engine of the chip; and processing signals transmitted by read blocks by utilizing a read application circuit in the chip, the read application circuit being coupled to read blocks of the universal IO units. Further, the chip may also be provided with other auxiliary circuits, such as a phase lock loop.

For example, the built-in control engine selectively enables signal receiving of the read blocks of the universal IO units according to functions of the universal IO units, or selectively enables signal driving of write blocks of the universal IO units according to functions of the universal IO units.

Therefore, the universal IO unit according to the present disclosure realizes different power functions and signal IO functions with a same circuit structure, so that in addition to yielding great design and application flexibilities, a design flow of the chip is also significantly simplified in a way that placement and routing of the universal IO units may be automatically completed by utilizing a computer with the aid of software.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
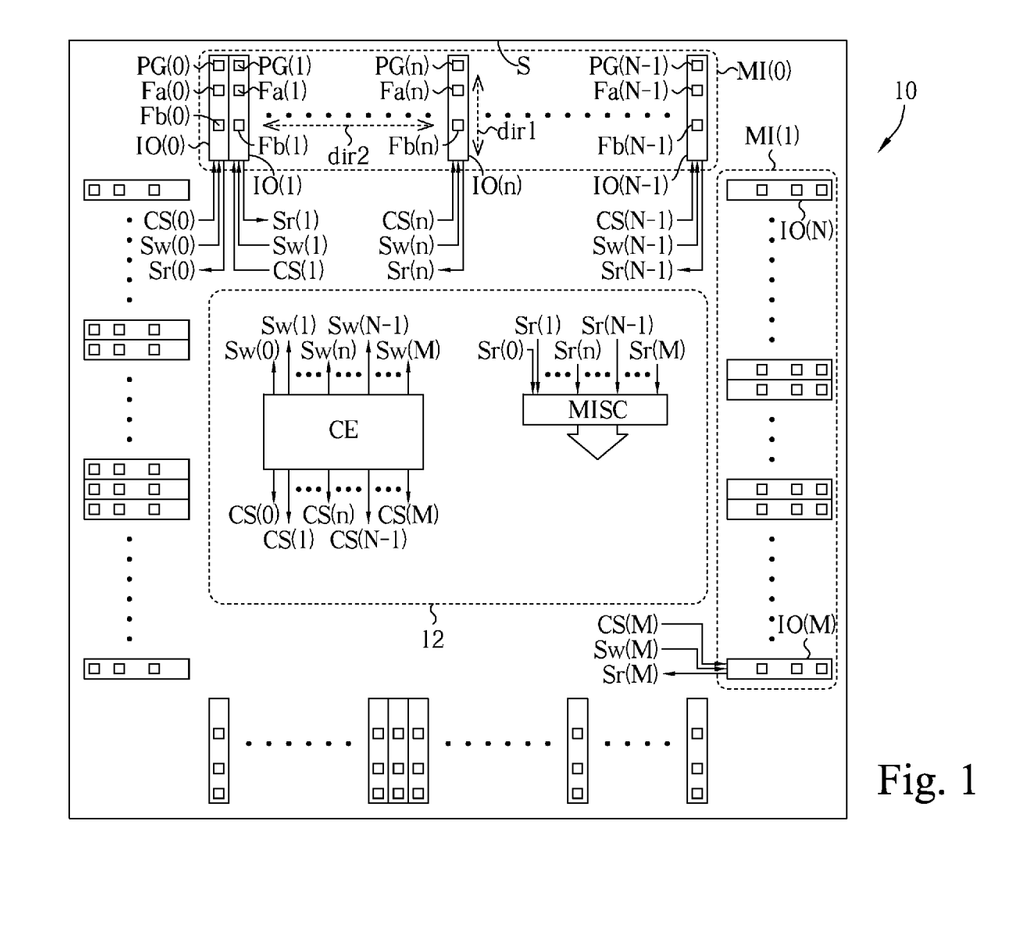
FIG. 1 is a schematic diagram of universal IO units of the invention applied to a chip.

FIG. 1 shows a schematic diagram of universal IO units of the invention applied to a chip 10 of the invention according to an embodiment of the present disclosure. Universal IO units IO(0), IO(1) ... IO(n) to IO(N−1), and universal IO unit (N) to IO(M) are respectively utilized to realize interfaces MI(0) and MI(1) for connecting to the external of the chip 10. Through the interfaces MI(0) and MI(1), an internal circuit 12 of the chip 10 is connected to circuits outside the chip 10 to exchange signals as well as acquiring electric power. Taking the universal IO unit IO(n) as an example, the universal IO units IO(n) is provided with a power pad PG(n) and two signal pads Fa(n) and Fb(n). The power pad PG(n) is selectively connected to a predetermined voltage (e.g., an operating voltage or ground) through a corresponding electric wire; the signal pads Fa(n) and Fb(n) are respectively connected to a corresponding signal wire.

Apart from the universal IO units, the chip 10 further comprises a control engine CE and a read application circuit MISC. The control engine CE sets functions corresponding to the universal IO unit IO(n) so that the signal pads Fa(n) and Fb(n) of the universal IO unit IO(n) are capable of respectively driving (outputting) signals and/or receiving signals according to the settings.

Figure 2:
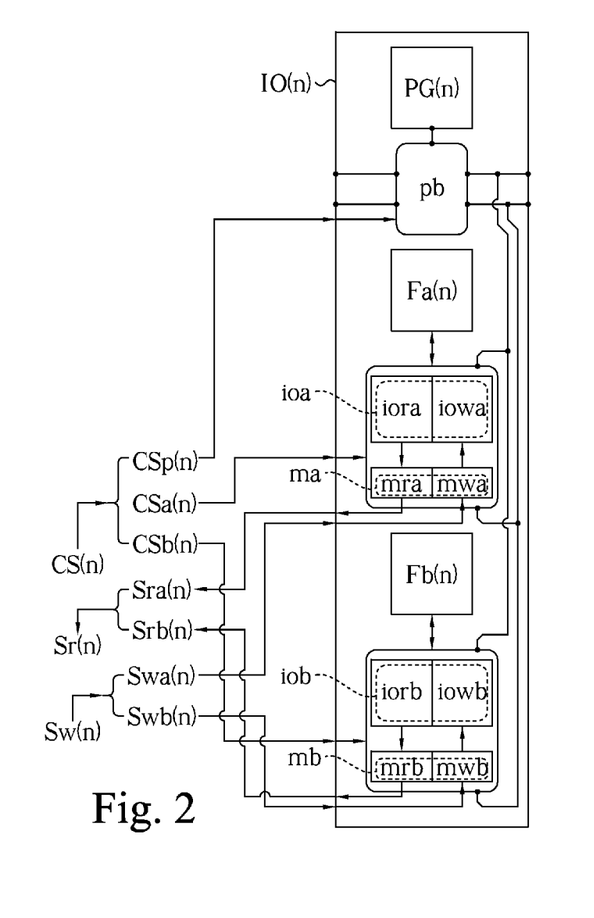
FIGS. 2 and 3 are schematic diagrams of the universal IO units in FIG. 1 according to different embodiments of the present disclosure.
Figure 3:
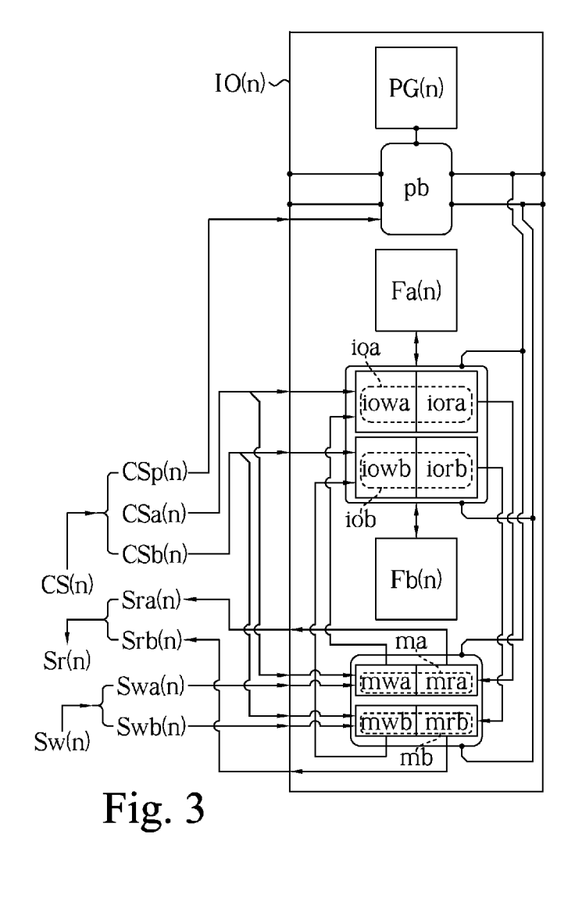

FIGS. 2 and 3 are schematic diagrams of the universal IO unit IO(n) of the invention for further illustrating the structure and operations of the universal IO unit IO(n). As shown in FIG. 1, in the embodiment in FIG. 2, the universal IO unit IO(n) of the invention comprises a power pad PG(n) and signal pads Fa(n) and Fb(n). The power pad PG(n) is selectively connected to a corresponding electric wire to couple to an operating voltage or ground as desired. The signal pads Fa(n) and Fb(n) are also selectively and respectively connected to a corresponding signal wire to perform signal driving and/or receiving as desired.

To independently set the functions of the pads, the pads PG(n), Fa(n) and Fb(n) are respectively provided with a corresponding IO circuit. For the power pad PG(n) and the signal pads Fa(n) and Fb(n), the universal IO unit IO(n) further correspondingly comprises a power block pb coupled to the power pad PG(n), and IO blocks ioa and iob as well as application blocks ma and mb, with the IO blocks ioa and iob respectively coupled to the signal pads Fa(n) and Fb(n) and the application blocks ma and mb respectively coupled to the IO blocks ioa and iob. By setting the pads and corresponding circuit blocks differently, different functions are rendered using the universal IO units of a same structure according to the present disclosure.

In one embodiment of the invention, the power block pb corresponding to the power pad PG(n) is provided with various power routings including power rails. When the universal IO units are located closely to one another to complete a chip interface, e.g., the neighboring universal IO units IO(0), IO(1) to IO(N−1) of the interface MI(0) in FIG. 1, the power blocks pb of the universal IO units are coupled to one another for power transmission among the IO blocks; alternatively, the universal IO units of the invention may also be closely arranged with other types of circuits, e.g., circuits of fixed functions, and power rails of these circuits are then coupled to the power rails of the universal IO units in order to achieve power transmission. Further, in each of the universal IO units IO(n), the power block pb is not only coupled to the power pad PG(n), but also transmits power to the IO blocks ioa and iob as well as to the application blocks ma and mb. Under such a structure, by coupling the power pad PG(n) of the universal IO unit IO(n) to an operating voltage or ground via a corresponding electric wire, the universal IO unit IO(n) is allowed to transmit external power, i.e., the power block pb is capable of transmitting power to the circuit blocks of the universal IO unit IO(n) as well as to other universal IO units (e.g., a neighboring IO IO(n−1) that do not have their power pads coupled to the operating voltage or ground. Accordingly, although the power pad PG(n−1) of the neighboring universal IO unit IO(n−1) is not connected to any power railings, the circuit blocks (IO blocks and applications blocks) of the universal IO unit IO(n−1) are still accessible to power. Other than power rails, the power block pb may also be provided with an electromagnetic static discharge (ESD) circuit and a power regulator, or any other power conversion circuit. From the control signal group CS(n), a control signal CSp(n) is for setting functions of the power block pb.

In the universal IO unit IO(n) of the invention, the IO blocks ioa and iob coupled to the corresponding signal pads Fa(n) and Fb(n) can be independently controlled to provide corresponding functions, and the application blocks ma and mb serve as interfaces between the corresponding IO blocks ioa and iob and the internal circuit 12 of the chip (FIG. 1). In one embodiment, each of the IO blocks ioa and iob is independently controlled to decide whether it is to be enabled, and the enabled IO blocks are controlled to selectively drive and/or receive signals, and also to selectively set the IO blocks so that the IO blocks (and to the application blocks) can operate based on different operating environments and function requirements, e.g., different speeds/frequencies, signal driving capabilities and operating voltages. Among the control signal group CS(n), a control signal CSa(n) is for setting/controlling functions of the IO block ioa and the application block ma; a control signal CSb(n) is for setting/controlling functions of the IO block iob and the application block mb. For example, the control signals CSA(n) and CSb(n) can be a single-bit or a multi-bit digital signal.

As shown in FIGS. 2 and 3, in the universal IO unit IO(n), the blocks ioa and iob respectively comprise IO read sub-block iora and iorb and IO write sub-block iowa and iowb. The sub-blocks iora and iowa are respectively controlled by the control signal CSa(n) to be selectively enabled or disabled. For the signal pad Fa(n), the IO block ioa is capable of receiving signals when the IO read sub-block iora is enabled by the control signal CSa(n), and is capable of driving signals when the IO read sub-block iowa is enabled. Similarly, in the signal pad Fb(n), signal driving and receiving capabilities of the sub-blocks iowb and iora are controlled by the control signal CSb(n).

To operate in conjunction with the sub-blocks of the IO blocks ioa and iob, the application blocks ma and mb are respectively provided with corresponding application read sub-blocks mra and mrb as well as corresponding write sub-blocks mwa and mwb. The application read sub-blocks mra and mrb, respectively coupled to corresponding IO read sub-blocks iora and iorb, serve as interfaces of the IO read sub-blocks iora and iorb. The application write sub-blocks mwa and mwb, respectively coupled to corresponding IO write sub-blocks iowa and iowb, serve as interfaces of the IO write sub-blocks iowa and iowb. The IO read sub-blocks iora and iorb, the IO write sub-blocks iowa and iowb, the application read sub-blocks mra and mrb, and the application write sub-blocks mwa and mwb are all controlled for desired operations and functions by the control engine CE as shown in FIG. 1.

Taking the signal pad Fa(n) for example, the application write sub-block mwa comprises circuits including a level shifter, and the IO write sub-block iowa comprises a driving circuit operating at a high operating voltage. When the signal pad Fa(n) is enabled to drive signals, a signal (i.e., a write signal Swa(n)) from the internal circuit 12 operating at a low operating voltage is converted, e.g., by level shifting, and transmitted to the IO write sub-block iowa, which then drives a signal from the application write sub-block mwa to the corresponding signal pad Fa(n).

Similarly, the IO read sub-block iora may be provided with circuits operating at a high operating voltage, e.g., a buffer circuit and/or a Schmitt trigger. When the signal pad Fa(n) is enabled to receive signals, a signal from outside the chip is transmitted via the signal pad Fa(n) and received by the IO read sub-block iora, and is then adjusted and converted by the level shift of the application read sub-block mra to a signal (i.e., a read signal Sra(n)) acceptable by the internal circuit 12 of the chip. More specifically, the IO read sub-block iora and the corresponding application read sub-block mra can be combined into a read block to achieve the signal receiving function of the signal pad Fa(n); the IO write sub-block iowa and the corresponding application write sub-block mwa can be combined into a write block to achieve the signal driving (outputting) function of the signal pad Fa(n).

Following the same circuit structure and operating principles, when the signal pad Fb(n) is enabled to drive signals, a write signal Swb(n) from inside the chip is transmitted externally by utilizing the application write sub-block mwb and the IO write sub-block iowb. Likewise, when the signal pad Fb(n) is enabled to receive signals, a signal received by the signal pad Fb(n) is transmitted to the internal circuit 12 by utilizing the IO read sub-block iorb and the application read sub-block mrb. The read signals Sra(n) and Srb(n) of the signal pads Fa(n) and Fb(n) can form a parallel read signal group Sr(n), and the write signals Swa(n) and Swb(n) can form a write signal group Sw(n).

In the embodiment shown in FIG. 2, the IO block ioa and the application block ma corresponding to the signal pad Fa(n) are arranged between the signal pads Fa(n) and Fb(n); the IO block iob and the application block mb corresponding to the signal pad Fb(n) are arranged at the other side of the signal pad Fb(n), i.e., the side away from the power pad PG(n).

In continuation of the embodiment shown in FIG. 2, in the embodiment shown in FIG. 3, the elements denoted with the same numberings have same operating principles such that details shall not be again given. However, in the embodiment in FIG. 3, the two IO blocks ioa and iob are together arranged between the corresponding signal pads Fa(n) and Fb(n), and the application blocks ma and mb corresponding to the IO blocks ioa and iob are together arranged at the other side of the two signal pads Fa(n) and Fb(n) away from the power pad PG(n). In general, during the process of layout, the IO blocks and the application blocks are arranged by following predetermined design rules, and under certain design rules, a necessary space is reserved between the IO blocks and the application blocks. Therefore, in the embodiment in FIG. 3, the IO blocks ioa and iob and the application blocks ma and mb are arranged in groups to save the space between the IO blocks and the application blocks. Further, with some manufacturing techniques, certain active components (active areas) may be directly disposed below the pads—such techniques may be implement to the universal IO units of the invention.

It is to be noted that the embodiments in both FIGS. 2 and 3 are applicable to the chip 10 in FIG. 1. Again with reference to FIG. 1, as previously described, the control engine CE in the internal circuit 12 of the chip 10 sets functions of the universal IO units IO(n) through the control signal group CS(n). The signal to be transmitted from the internal circuit 12 is distributed as the write signal group Sw(n) that is then driven and outputted by an appropriate universal IO unit IO(n), and the read signal group Sr(n) received by the universal IO unit IO(n) is then received by the read application circuit MISC. The read application circuit MISC is coupled to the application read sub-blocks mra and mrb (as shown in FIGS. 2 and 3) of the universal IO units IO(n) for processing read signals Sra(n) and Srb(n) transmitted from the application read sub-blocks mra and mrb. For example, the read application circuit MISC comprises a latch circuit for sampling and latching signals of the application read sub-blocks to form corresponding digital signals that are to be read by the internal circuit 12 of the chip. Further, the read application circuit MISC may also be provided with a serializer/deserializer (SERDES) for converting the parallel read signals of different pads to digital serial signals. The internal circuit 12 may also be provided with other auxiliary circuits such as a phase lock loop.

In the embodiment in FIG. 1, the power pad PG(n) and the signal pads Fa(n) and Fb(n) of the universal IO unit IO(n) are arranged along one direction dir1 as a same column. The direction dir1 is parallel to a side of the universal IO unit IO(n) in a way that the universal IO unit IO(n) forms a row by being arranged along a direction dir2 with other universal IO units (e.g., universal IO units IO(0) to IO(N−1), or other types of circuit units). The direction dir1 is perpendicular to the direction dir2. Further, neighboring power pads of neighboring universal IO units are aligned with one another along the direction dir2, and neighboring signal pads of neighboring universal IO units are also aligned with one another. Since a universal IO unit IO(n) of the invention comprises a plurality of (e.g., three) functionally independent pads at a same column, integration of the IO pads is greatly enhanced to reduce layout area and size of the chip.

Between the pads PG(n), Fa(n) and Fb(n) arranged in columns, the signal pads Fa(n) and Fb(n) are disposed at a same side as the power pad PG(n), such that an opposite side of the power pad PG(n) remains free from any signal pads; that is, the power pad PG(n) is arranged at an outermost side of the universal IO unit IO(n) to locate closest among all the pads to an edge S of the chip.

In conclusion, the control engine CE in the chip 10 of the invention is capable of independently setting the IO blocks ioa and iob of the universal IO unit IO(n) to selectively enable signal driving and receiving capabilities to achieve great application flexibilities. For example, the chip 10 can be a memory controller chip for controlling and accessing an externally connected memory, and the universal IO units IO(n) in the chip 10 then serve as the memory interface of the memory controller chip.

To control or access the memory, the memory controller chip sends to the memory clock, address and command signals that operate in conjunction with the data strobe signal to transmit data signals to the memory and to receive data signals from the memory. When implementing techniques to a memory controller chip, an IO block ioa of a universal IO unit IO(n) is set to drive and receive signals, so as to transceive data signals or data strobe signals via a corresponding signal pad Fa(a). Further, an IO block iob of the universal IO unit IO(n) or IO blocks ioa and iob of another universal IO unit are controlled to drive signals, so as to output memory clock, address or command signals via corresponding signal pads of the IO blocks.

Therefore, embodiments of the present invention are configured to achieve different IO functions with the universal IO units having a same circuit structure. Since the signal pads and corresponding IO blocks of each of the universal IO units are independently controlled, multiple signal IO functions can be realized by merely one universal IO unit through appropriate signal wire connections. For example, a same IO is capable of transceiving data signals via a signal pad as well as outputting address signals via another signal pad. Accordingly, the universal IO unit of the invention renders optimized design and application flexibilities.

Figure 4:
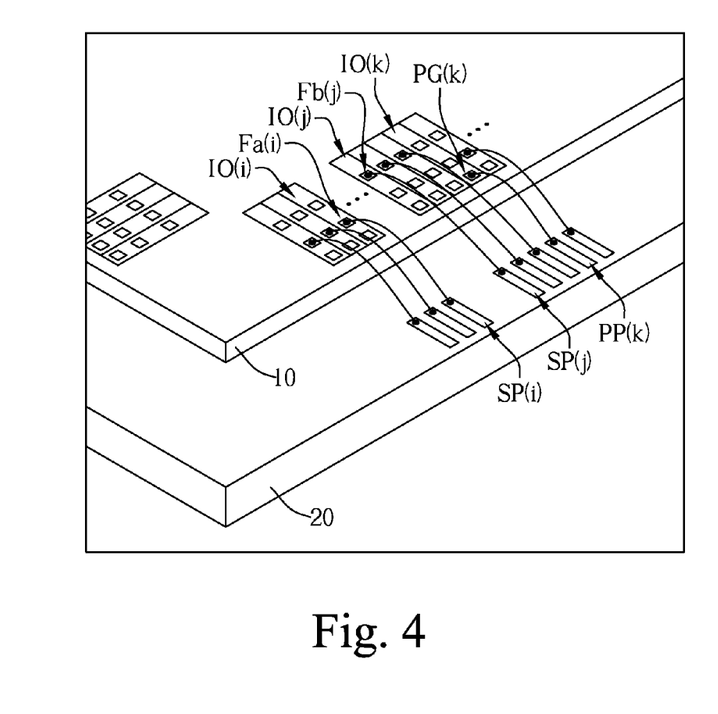
FIGS. 4 to 6 are schematic diagrams of the chip in FIG. 1 applied in different embodiments of the present disclosure.
Figure 5:
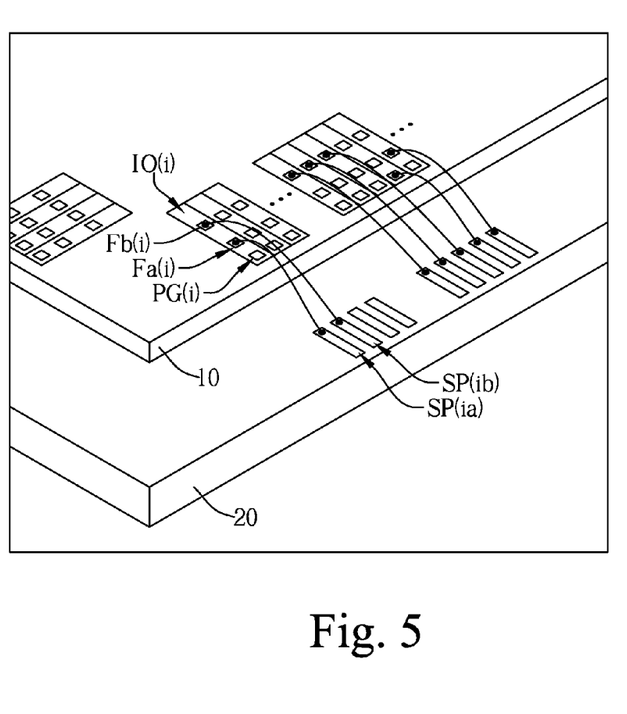

FIGS. 4 and 5 show schematic diagrams of a packaged integrated circuit realized by the chip 10 of the invention and a substrate 20 according to an embodiment of the present invention. For example, the substrate 20 is a ball grid array (BGA) substrate or a quad flat package (QFP) substrate. The integrated circuit may also be a silicon-in-package (SiP) integrated circuit packaged from a plurality of chips to a substrate, and thus connections between the chip and the substrate described in the embodiments below can be also applicable to connections between chips.

As previously illustrated, the universal IO units having a same structure, through controls and settings by a control engine CE (in FIG. 1) of the invention, are capable of satisfying different function requirements. One of the basic applications of the universal IO units is coupling one of the power pad PG(n) or the signal pads Fa(n) and Fb(n) in one of the universal IO units to the substrate 20 by connection using an electric wire or a signal wire (e.g., bonding)—FIG. 4 shows a schematic diagram of an embodiment using such application. As shown in FIG. 4, a power pad PG(k) of a universal IO unit IO(k) is coupled to a power pin PP(k) of the substrate 20 to obtain an operating voltage; meanwhile, other signal pads of the universal IO unit IO(k) are left unconnected to the substrate 20 such that corresponding IO blocks and application blocks are disabled. Another universal IO unit IO(i) has its single signal pad Fa(i) coupled to a signal pin SP(i) of the substrate 20 for signal exchange, and has its other signal pads left unconnected to the substrate 20. Likewise, a universal IO unit IO(j) is coupled to a signal pin SP(j) of the substrate 20 via its single signal pad Fb(j).

FIG. 5 shows a schematic diagram of another application according to an embodiment of the present invention. With appropriate connections, two signal pads Fa(i) and Fb(i) of a same universal IO unit IO(i) can be respectively connected to two independent signal pins SP(ia) and SP(ib) of a substrate through two isolated signal wires, so that the same universal IO unit is allowed to independently achieve two different signal IO functions at the same time. It is to be noted that a power pad PG(i) of the universal IO unit IO(i) need not be coupled to the substrate 20.

Figure 6:
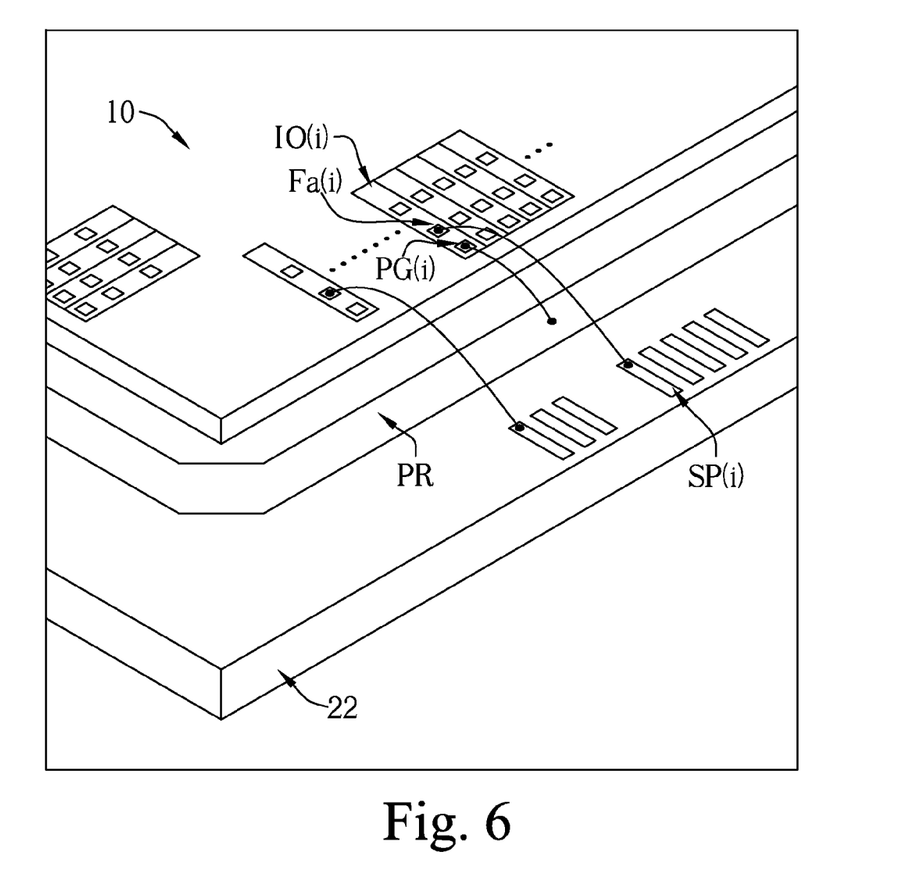

FIG. 6 shows a schematic diagram of the chip 10 of the invention and a substrate 22 according to yet another embodiment of the present invention. The substrate 22 comprises a power ring PR for providing an operating voltage supply. In the chip 10, the power pad PG(i) of the universal IO unit IO(i) is connected to the power ring PR via a corresponding electric wire, and the signal pad Fa(i) of the same universal IO unit IO(i) is connected to the signal pin SP(i) of the substrate 22 via a corresponding signal wire, so that the universal IO unit IO(i) achieves not only signal IO functions but also power transmission between the power ring PR and the chip 10.

Figure 7:
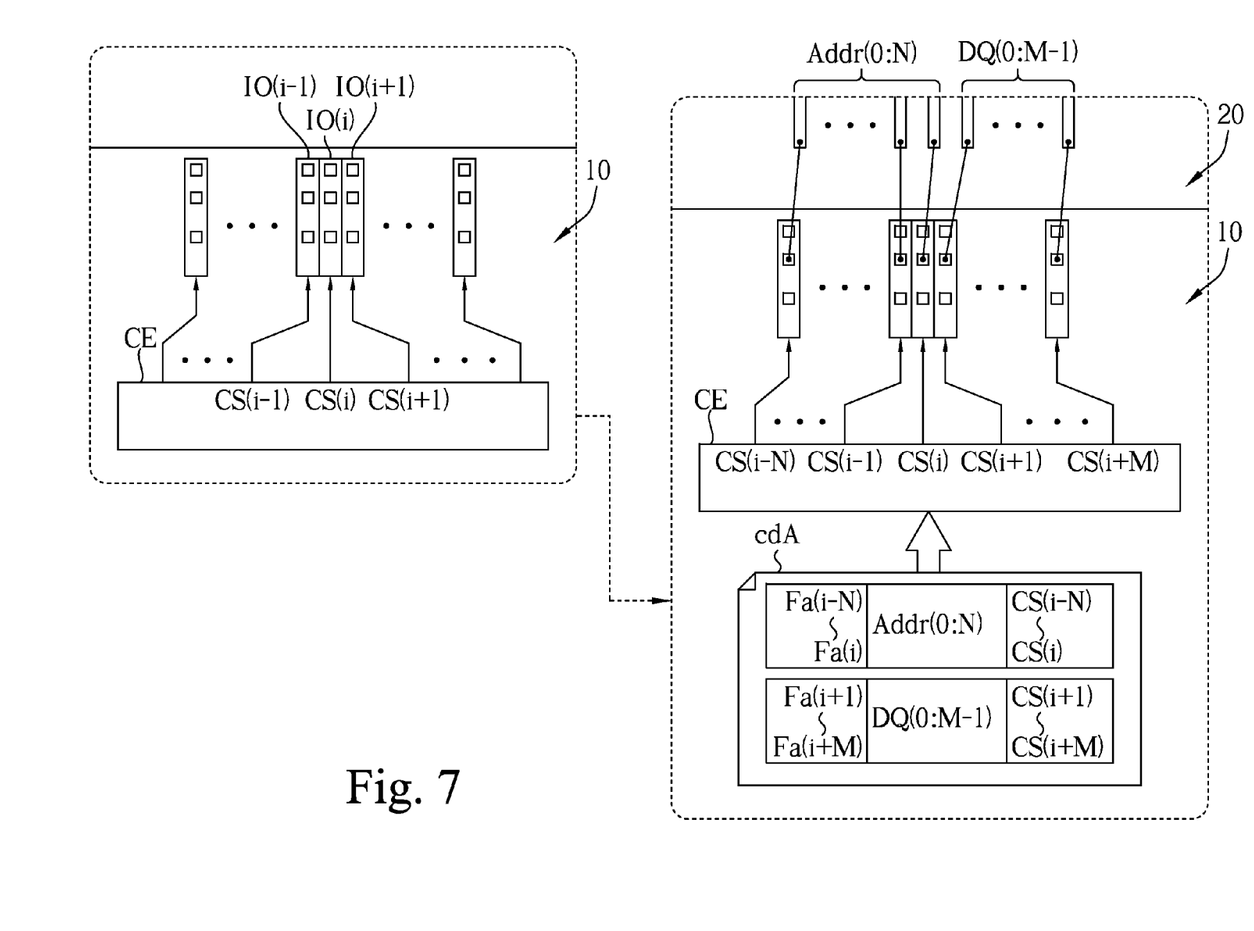
FIGS. 7 and 8 are schematic diagrams of setting the chip in FIG. 1 according to different embodiments of the present disclosure.
Figure 8:
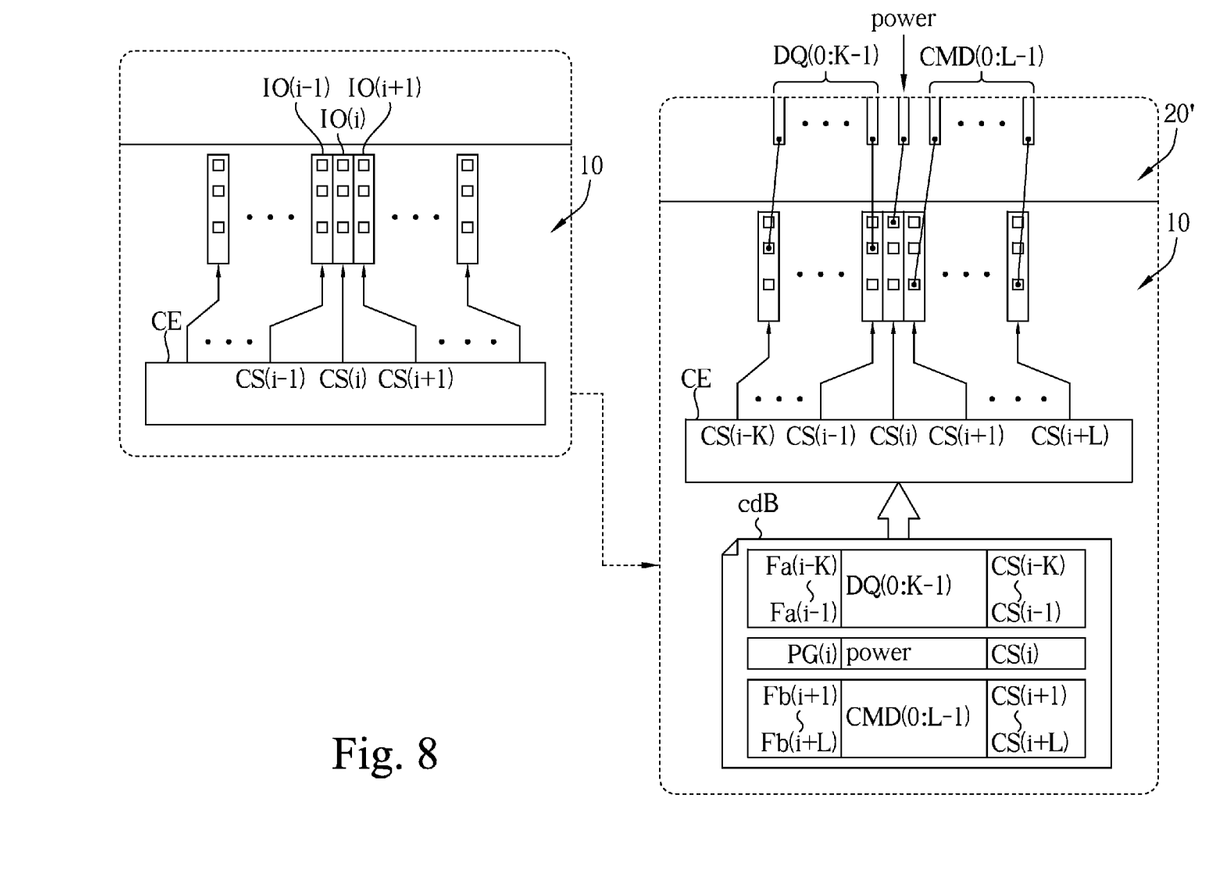

In an embodiment of the chip 10 of the invention, the control engine CE is activated to load program code at start-up of the chip 10, and respectively sets functions of the universal IO units according to execution of the program code. Thus, in cooperation of an appropriate substrate, integrated in different types are formed using the chip of a same structure. FIGS. 7 and 8 respectively show schematic diagrams of different integrated circuits realized by a same chip according to embodiments of the present disclosure.

In FIG. 7, the chip 10 of the invention respectively sets functions of the universal IO units IO(i−1), IO(i) and IO(i+1) by utilizing control signal groups CS(i−1), CS(i) and CS(i+1). When the chip 10 is assembled with the substrate 20, suppose that signal pads Fa(i−N) to Fa(i) of universal IO units IO(i−N) to IO(i) are respectively defined as $0^{th}$ to $N^{th}$ bits (denoted as Addr(0:N) in FIG. 7) of an address signal, and signal pads Fa(i+1) to Fa(i+M) of universal IO units IO(i+1) to IO(i+M) are defined as data signals DQ(0:M−1). Further, the program code cdA correspondingly defines functions of the signal pads Fa(i−N) to Fa(i) and Fa(i+1) to Fa(i+M), and records corresponding control signal groups CS(i−N) to CS(i) and CS(i+1) to CS(i+M).

When the program code cdA is executed by the chip 10, the control engine CE can set the universal IO units IO(i−N) to IO(i) and IO(i+N) to IO(i+M) by utilizing the control signal groups CS(i−N) to CS(i) and CS(i+1) to CS(i+M). For example, the control engine CE sets function of the signal pads Fa(i−N) to Fa(i) to drive/output signals of address signals Addr(0:N), and enables the signal pads Fa(i+1) to Fa(i+M) to both drive ad receive signals so as to read and write data signals DQ(0:M−1).

In the embodiment shown in FIG. 8, the same chip 10 is customized into a different type of integrated circuit using another substrate 20'. In the integrated circuit, signal pads Fa(i−K) to Fa(i−1) are defined as data signals DQ(0:K−1), a power pad PG(i) is defined as a power pin (indicated as power in FIG. 8), and signal pads Fb(i+1) to Fb(i+L) of universal IO units IO(i+1) to IO(i+L) are defined as command signals CMD(0:L−1). To match the foregoing definitions, a program code cdB is recorded with functions of the universal IO unit IO(i−K) to IO(i+L) and corresponding control signal groups CS(i−K) to CS(i+L). When the program code cdB is executed by the control engine CE, the signal pads Fa(i−K) to Fa(i−1) are enabled to both drive and receive signals so as to transceive the data signals DQ(0:K−1); and the universal IO unit IO(i) is set for power transmission. For the signal pads Fb(i+1) to Fb(i+L), signal driving capabilities are enabled to transmit (write) command signals CMD(0:L−1).

In practice, the control engine may set associated registers after executing the program code. According to status bits of the registers, the control engine respectively sets functions of the universal IO units.

The program code can be stored in an external memory (e.g., a non-volatile memory) of the chip, and is loaded to the chip 10 and control engine CE of the invention at start-up of the chip/integrated circuit of the invention. In another embodiment, the chip 10 may be provided with a built-in non-volatile memory for storing the program code. Due to high application flexibilities of the universal IO units of the invention, a same IO structure is capable of achieving memory interfaces of different specifications (e.g., double data rate (DDR), DDR2 and DDR3) when applied to a memory controller chip.

Therefore, the universal IO unit according to the present disclosure realizes different power functions and signal IO functions with a same circuit structure, so that in addition to yielding great design and application flexibilities, a design flow of the chip is also significantly simplified in a way that placement and routing of the universal IO units may be automatically completed by utilizing a computer with the aid of software.

Figure 9:
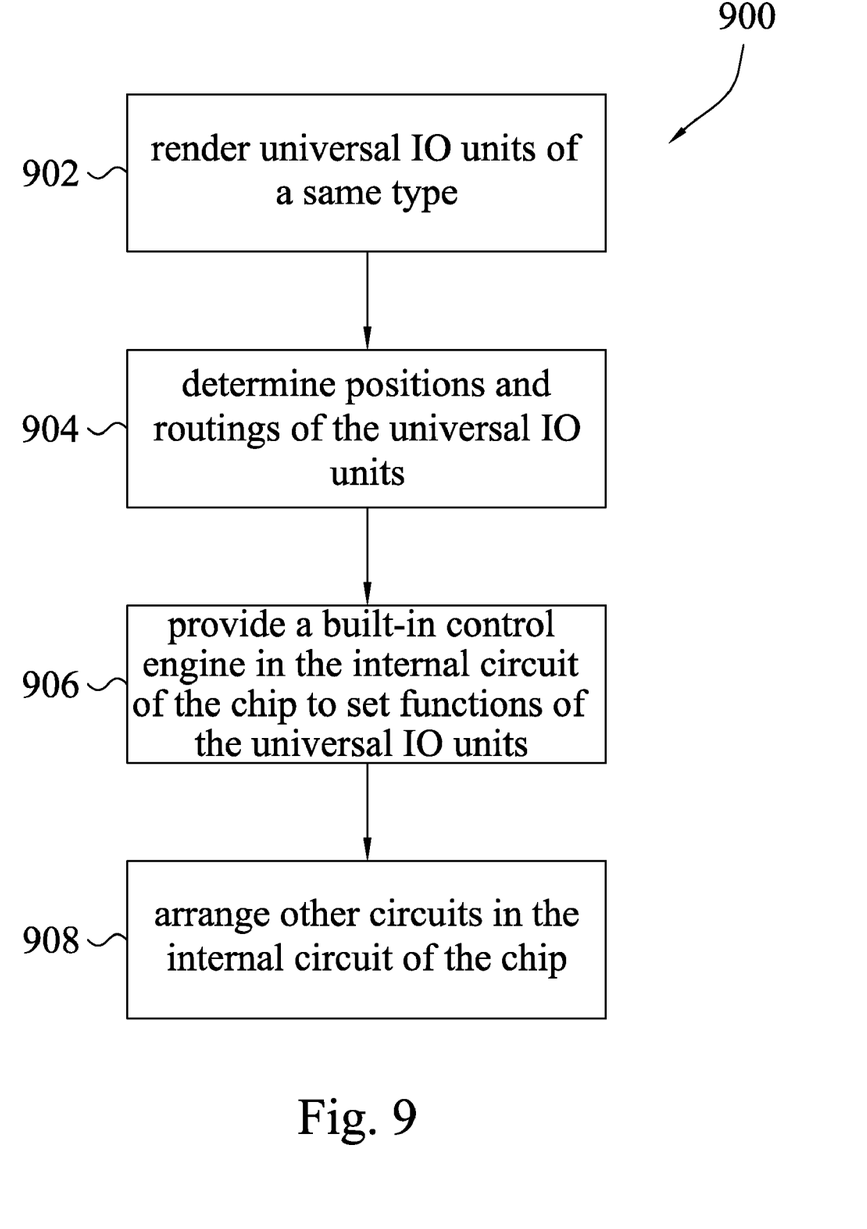
FIG. 9 is a flowchart for designing a chip applying the universal IO units of the invention.

FIG. 9 shows a flow 900 for designing a chip, and more particularly, its IO interface, when implementing the universal IO units of the invention. The flow 900 comprises steps below. In Step 902, a plurality of universal IO units of a same type are provided. The universal IO units are configured to realize different functions as previously described. In this step, universal IO units, the number of universal IO units and functions of the universal IO units, can be determined according to functional requirements of the integrated circuit, chip and interface.

In Step 904, for the universal IO units in the previous step, positions and routings of the universal IO units are determined by executing an automatic placement and routing software tool with the aid of a computer.

In Step 906, a (digital) built-in control engine is provided in the internal circuit of the chip to set functions of the universal IO units. For example, appropriate digital control logic and registers are provided in the control engine, so that the control engine can selectively enable read blocks of the universal IO units to receive signals and also selectively enable write blocks of the universal IO units to drive signals according to functions of the universal IO units.

In Step 908, other circuits are arranged in the internal circuit of the chip. For example, the chip may also be provided with a read application circuit as in the foregoing description, or be built-in with other auxiliary circuits, such as a phase lock loop.

The order of the above steps may be adjusted based on actual needs. For example, Step 906 and 908 may be performed before Step 904; that is, positions and routings of the control engine, the auxiliary circuits and the universal IO units are determined by automatic placement and routing techniques.

Before performing Step 902 of the flow 900, the universal IO units of the invention may first be designed, with the designs and settings recorded to a circuit cell library as a circuit design resource. When design or customization of a chip is desired, the universal IO units are then readily available from the circuit cell library for immediate use.

In conclusion, compared to the prior art, the universal IO units and associated techniques of the invention are capable of rendering different functions using universal IO units of a same structure, thereby providing optimized application flexibilities as well as enhancing interface integration. Further, the universal IO units may be extensively applied such that the chip implementing the universal IO units are enabled with better flexibilities to accommodate requirements of different integrated circuits.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A chip, comprising:
   a control engine; and
   a plurality of universal IO units, coupled to the control engine, each of the universal IO units comprising:
   a power pad, selectively connected to an electric wire to couple to a predetermined voltage;
   a plurality of signal pads, each of which being selectively connected to a signal wire to transmit signals; and
   a plurality of function blocks, each coupled to the corresponding one of the plurality of signal pads and independently set to possess a function by the control engine,
   wherein in each of the universal IO units, the power pad and the signal pads are arranged as a column along a first direction, and the power pad of each neighboring universal IO unit is arranged in alignment along a second direction perpendicular to the first direction.

2. The chip as claimed in claim 1, wherein each of the universal IO units further comprises a power block coupled to the power pad to transmit electric power to the function blocks.

3. The chip as claimed in claim 1, wherein the universal IO units are applied to a memory interface, and the control engine controls one of the function blocks of at least one of the universal IO units to drive and receive signals, so as to transceive a data signal or a data strobe signal through the corresponding signal pad of the at least one function block.

4. The chip as claimed in claim 1, wherein the universal IO units are applied to a memory interface, and the control engine controls one of the function blocks of at least one of the universal IO units to drive signals, so as to output a memory clock, an address signal or a command signal from the corresponding signal pad of the at least one function block.

5. The chip as claimed in claim 1, wherein the control engine executes a program code at start-up of the chip, and respectively sets the function blocks of the universal IO units according to an execution of the program code.

6. A chip, comprising:
   a control engine; and
   a plurality of universal IO units, coupled to the control engine, each of the universal IO units comprising:
   a power pad, selectively connected to an electric wire to couple to a predetermined voltage;
   a plurality of signal pads, each of which being selectively connected to a signal wire to transmit signals; and
   a plurality of function blocks, each coupled to the corresponding one of the plurality of signal pads and independently set to possess a function by the control engine,
   wherein in each of the universal IO units, the power pad and the signal pads are arranged as a column along a first direction, and the signal pads of neighboring universal IO units are arranged in alignment along a second direction perpendicular to the first direction.

* * * * *